(12) United States Patent
Kao et al.

(10) Patent No.: US 9,209,163 B2
(45) Date of Patent: Dec. 8, 2015

(54) PACKAGE-ON-PACKAGE STRUCTURES

(75) Inventors: Huahung Kao, San Jose, CA (US);
Shiann-Ming Liou, Campbell, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/584,027

(22) Filed: Aug. 13, 2012

(65) Prior Publication Data

US 2013/0043587 A1 Feb. 21, 2013

Related U.S. Application Data

(60) Provisional application No. 61/525,521, filed on Aug. 19, 2011.

(51) Int. Cl.
*H01L 25/10* (2006.01)
*H01L 25/16* (2006.01)
(Continued)

(52) U.S. Cl.
CPC .............. *H01L 25/105* (2013.01); *H01L 24/73* (2013.01); *H01L 25/16* (2013.01); *H01L 23/3128* (2013.01); *H01L 24/05* (2013.01); *H01L 24/06* (2013.01); *H01L 24/13* (2013.01); *H01L 24/14* (2013.01); *H01L 24/16* (2013.01); *H01L 25/0655* (2013.01); *H01L 2224/0401* (2013.01); *H01L 2224/0557* (2013.01); *H01L 2224/05624* (2013.01); *H01L 2224/05647* (2013.01); *H01L 2224/06181* (2013.01); *H01L 2224/13025* (2013.01); *H01L 2224/1403* (2013.01); *H01L 2224/14181* (2013.01); *H01L 2224/16225* (2013.01); *H01L 2224/16227* (2013.01); *H01L 2224/32225* (2013.01); *H01L 2224/48227* (2013.01); *H01L 2224/73204* (2013.01); *H01L 2224/73207* (2013.01); *H01L 2224/73215* (2013.01); *H01L 2224/73253* (2013.01); *H01L 2224/73265* (2013.01); *H01L 2225/107* (2013.01); *H01L 2225/1052* (2013.01); *H01L 2225/1058* (2013.01);
(Continued)

(58) Field of Classification Search
CPC ..... H01L 25/162; H01L 25/115; H01L 25/117; H01L 25/105; H01L 24/73; H01L 2924/15321
USPC ............ 257/738, 686, 723, E21.03, E25.006, 257/E25.013, E25.021, E25.027
See application file for complete search history.

(56) References Cited

U.S. PATENT DOCUMENTS 6,339,254 B1   1/2002   Venkateshwaran et al.
7,446,419 B1 * 11/2008   Lin et al. ................. 257/777
(Continued)

OTHER PUBLICATIONS

The PCT Search Report mailed Jan. 15, 2013 for PCT application No. PCT/US12/50953, 26 pages.
(Continued)

*Primary Examiner* — Mamadou Diallo
*Assistant Examiner* — Christina Sylvia

(57) ABSTRACT

Embodiments of the present disclosure provide a package on package arrangement comprising a bottom package and a second package. The first package includes a substrate layer including (i) a top side and (ii) a bottom side that is opposite to the top side. Further, the top side defines a substantially flat surface. The first package also includes a die coupled to the bottom side of the substrate layer. The second package includes a plurality of rows of solder balls, and the second package is attached to the substantially flat surface of the substrate layer via the plurality of rows of solder balls.

19 Claims, 10 Drawing Sheets

(51) Int. Cl.
*H01L 23/31* (2006.01)
*H01L 23/00* (2006.01)
*H01L 25/065* (2006.01)

(52) U.S. Cl.
CPC .................. *H01L 2225/1088* (2013.01); *H01L 2225/1094* (2013.01); *H01L 2924/00014* (2013.01); *H01L 2924/01029* (2013.01); *H01L 2924/10253* (2013.01); *H01L 2924/1433* (2013.01); *H01L 2924/1436* (2013.01); *H01L 2924/1437* (2013.01); *H01L 2924/1438* (2013.01); *H01L 2924/15311* (2013.01); *H01L 2924/15321* (2013.01); *H01L 2924/1815* (2013.01); *H01L 2924/18161* (2013.01); *H01L 2924/3025* (2013.01)

(56) References Cited

U.S. PATENT DOCUMENTS

| | | | |
|---|---|---|---|
| 7,696,616 | B2 | 4/2010 | Shinma et al. |
| 8,012,797 | B2 | 9/2011 | Shen et al. |
| 2002/0079568 | A1 | 6/2002 | Degani et al. |
| 2003/0001281 | A1* | 1/2003 | Kwon et al. ................ 257/777 |
| 2004/0145039 | A1 | 7/2004 | Shim et al. |
| 2004/0212080 | A1* | 10/2004 | Chen et al. ................ 257/712 |
| 2004/0261988 | A1 | 12/2004 | Sauciuc et al. |
| 2005/0121764 | A1* | 6/2005 | Mallik et al. ............... 257/686 |
| 2005/0248010 | A1 | 11/2005 | Ono et al. |
| 2007/0241441 | A1* | 10/2007 | Choi et al. ................. 257/686 |
| 2008/0272477 | A1 | 11/2008 | Do et al. |
| 2009/0278242 | A1* | 11/2009 | Chuang et al. ............. 257/676 |
| 2011/0074028 | A1* | 3/2011 | Pendse ...................... 257/737 |
| 2011/0127662 | A1* | 6/2011 | Yang et al. ................. 257/686 |
| 2011/0149493 | A1 | 6/2011 | Kwon et al. |
| 2011/0156235 | A1* | 6/2011 | Yuan .......................... 257/690 |
| 2012/0126396 | A1* | 5/2012 | Zhao et al. ................. 257/737 |
| 2014/0151880 | A1 | 6/2014 | Kao et al. |

OTHER PUBLICATIONS

PCT Search Report and Written Opinion mailed Jun. 17, 2014 for PCT Application No. PCT/US14/15810, 27 Pages.

* cited by examiner

PACKAGE-ON-PACKAGE STRUCTURES

CROSS REFERENCE TO RELATED APPLICATION

This disclosure claims priority to U.S. Provisional Patent Application No. 61/525,521, filed Aug. 19, 2011, the entire specification of which is hereby incorporated by reference in its entirety for all purposes, except for those sections, if any, that are inconsistent with this specification.

TECHNICAL FIELD

Embodiments of the present disclosure relate to package on package (POP) structures, and more particularly to packaging arrangements that incorporate a base package with a die-down flipped structure.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Typically, with many multi-chip packaging arrangements, a packaging arrangement is arranged in one of either a package-on-package (PoP) arrangement, or a multi-chip module (MCM) arrangement. These packaging arrangements tend to be fairly thick (e.g., approximately 1.7 millimeters to 2.0 millimeters).

A PoP arrangement may include an integrated circuit that combines two or more packages on top of each other. For instance, a PoP arrangement may be configured with two or more memory device packages. A PoP arrangement may also be configured with mixed logic-memory stacking that includes logic in a bottom package and memory in a top package or vice versa.

Typically, a die of associated with a package located on the bottom of a PoP arrangement (referred to herein as a "bottom package") limits the footprint of a package located above the bottom package (referred to herein as a "top package") to be a certain size. Additionally, such a configuration generally limits the top package to two rows of peripheral solder balls. An example of such a packaging arrangement 800 is illustrated in FIG. 8 and includes a top package 802 and a bottom package 804. As can be seen, the bottom package 804 includes a die 806 attached to a substrate 808 via an adhesive 810. The die 806 is coupled to the substrate 808 via a wirebonding process with wires 812. Solder balls 814 are provided for coupling the packaging arrangement 800 to another substrate (not illustrated) such as, for example, a printed circuit board (PCB). The top package 802 includes a die 816 coupled to a substrate 818. Solder balls 820 are provided to couple the top package 802 to the bottom package 804. The top package 802 may include an enclosure 822, generally in the form of an encapsulant, if desired. As can be seen, only two rows of solder balls 820 can be provided due to the presence of the die 806 and an enclosure 824 (generally in the form of an encapsulant and which may or may not be included) of the bottom package 804. Thus, top packages may be required to have larger sizes or footprints to avoid the die 806 of bottom packages when a top package is attached to the bottom package. Such packaging arrangements 800 can also present problems with clearance issues for the top package 802 with respect to the die 806 and/or enclosure 824.

FIG. 9 illustrates another example of a packaging arrangement 900 where a bottom package 904 has been created with a Mold-Array-Process (MAP). The bottom package 904 is similar to the bottom package 804 of FIG. 8 and includes an encapsulant 906. The encapsulant 906 is generally etched to expose solder balls 908. Alternatively, the encapsulant 906 is etched and then solder balls 908 are deposited within the openings 910. Such a packaging arrangement 900 once again only allows for the inclusion of two rows of solder balls 820 around the periphery of the top package 802 due to the presence of the die 806 and the encapsulant 906. Such packaging arrangements 900 can also present problems with clearance issues for the top package 802 with respect to the die 806 and the encapsulant 906, as well as alignment issues with respect to the openings 910.

SUMMARY

In various embodiments, the present disclosure provides a package on package structure comprising a package on package arrangement comprising a bottom package and a second package. The first package includes a substrate layer including (i) a top side and (ii) a bottom side that is opposite to the top side. Further, the top side defines a substantially flat surface. The first package also includes a die coupled to the bottom side of the substrate layer. The second package includes a plurality of rows of solder balls, and the second package is attached to the substantially flat surface of the substrate layer via the plurality of rows of solder balls.

The present disclosure also provides a method comprising providing a first package including a substrate layer. The substrate layer includes (i) a top side and (ii) a bottom side that is opposite to the top side. The top side of the substrate layer defines a substantially flat surface. The first package further includes a die coupled to the bottom side of the substrate layer. The method further comprises providing a second package having a plurality of rows of solder balls attached to a bottom surface of the second package, and attaching, via the plurality of rows of solder balls of the second package, the second package to the substantially flat surface of the first package.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1A:
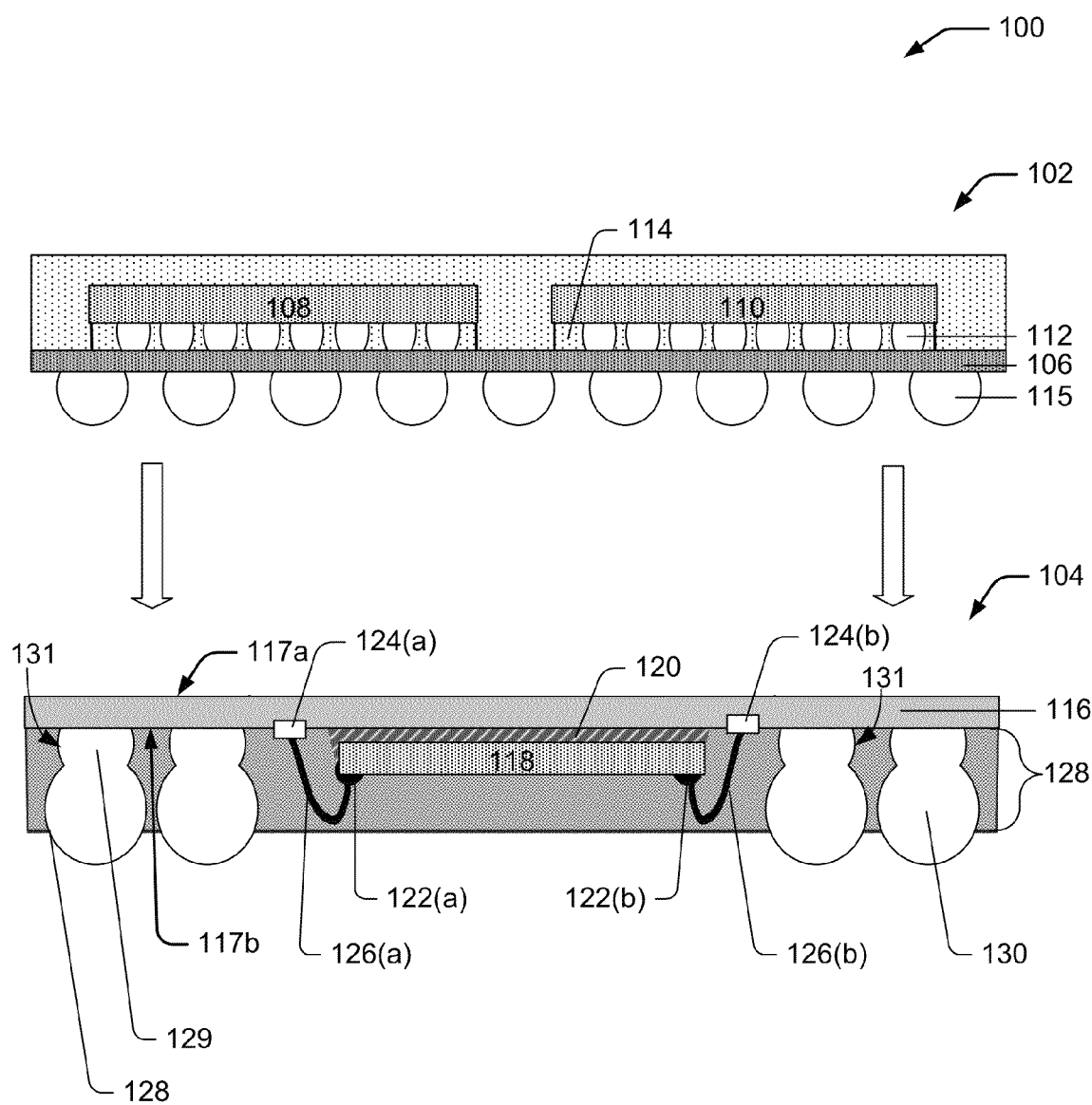
FIG. 1A schematically illustrates an example packaging arrangement that includes an example die arrangement of a die-down flipped PoP structure.

FIG. 1A illustrates a packaging arrangement 100 according to an embodiment where a package on package (PoP) packaging arrangement includes a top package 102 and a bottom package 104. For illustrative purposes, the packages are illustrated as separate items. The top package 102 includes a substrate layer 106. A die arrangement within the top package 102 may include a first die 108 and a second die 110, in which each die 108, 110 is attached to the substrate layer 106 via solder balls 112. This configuration may include underfill material 114 in space between the solder balls 112 and the substrate layer 106. The solder balls 112 are generally located at bond pads or contact areas (not illustrated). The dies 108, 110 can be coupled to the substrate layer 106 via a flip-chip operation. Alternatively, a wire bonding process and an adhesive layer (not illustrated) may be used to couple the dies 108, 110 to the substrate layer 106. Additionally, top package 102 may comprise two or more individual top packages 102 (not illustrated), where each individual top package 102 includes one or more dies.

In accordance with various embodiments, the first die 108 and the second die 110 are memory devices and, in accordance with an embodiment, the first die 108 and the second die 110 are mobile double data rate (mDDR) synchronous dynamic random access memory (DRAM) for mobile devices. Mobile DDR is also known as low power DDR. However, other types of memory devices may be utilized, including but not limited to a double data rate synchronous dynamic random-access memory (DDR SDRAM), a dynamic random access memory (DRAM), a NOR or a NAND Flash memory, a static random-access memory (SRAM), and the like.

In accordance with another embodiment, the top package 102 with the first die 108 and the second die 110 is directed towards application-specific products, and, in accordance with an embodiment, the first die 108 and/or the second die 110 may represent application-specific integrated circuits (ASICs) for a mobile device.

The top package 102 further includes a plurality of solder balls 115. The plurality of solder balls 115 may be attached to a bottom side of the substrate layer 106 of the top package 102. In the embodiment of FIG. 1A, the plurality of solder balls 115 forms a configuration for electrically and physically attaching or stacking the top package 102 on the bottom package 104.

For clarity, materials used within the top package 102 and other components within the top package 102 may not be illustrated and/or described in detail herein. Such materials and components are generally well-known in the art.

The bottom package 104 includes a substrate layer 116 that includes a top side 117a and a bottom side 117b. As shown in FIG. 1A, the top side 117a defines a substantially flat surface of the bottom package 104, i.e. a substantially smooth surface that is substantially free of grooves, bumps, indentations, valleys, etc. In one embodiment, the substantially flat surface of the top side 117a does not contain any components, which permits the top side 117a to receive (or support) various designs and selections of the top package 102. Thus, the flat top surface of the bottom package 104 provides a convenient way for the plurality of solder balls 115 of the top package 102 to attach to the bottom package 104, which allows for greater flexibility in designing top package 102 (or multiple individual top packages 102) and thereby, designing packaging arrangement 100.

The bottom package 104 includes a die 118 attached to the bottom side 117b of the substrate layer 116 via an adhesive layer 120 in a die-down flipped structure. In other embodiments, as will be further discussed herein, the die 118 may be attached to the bottom side 117b of the substrate layer 116 via solder balls.

In accordance with various embodiments, the die 118 may be a memory device, such as a mobile double data rate (mDDR) synchronous dynamic random access memory (DRAM) for mobile devices. Other types of memory devices may be utilized, including but not limited to a double data rate synchronous dynamic random-access memory (DDR SDRAM), a dynamic random access memory (DRAM), a NOR or a NAND Flash memory, a static random-access memory (SRAM), and the like. In accordance with another embodiment, the die 118 may be a logic device to create a mixed logic-memory stacking that includes logic on the bottom package 104 and memory on the top package 102.

The die 118 has surfaces that include one or more bond pads 122a, 122b. The one or more bond pads 122a, 122b generally comprise an electrically conductive material such as, for example, aluminum or copper. Other suitable materials can be used in other embodiments. The die 118 is coupled to one or more substrate pads 124a, 124b located on the substrate layer 116 via bonding wires 126a, 126b that are coupled to corresponding bond pads 122a, 122b. The die 118 may be affixed to the bottom package 104 by molding material. In other embodiments, the die 118 may electrically interconnect with the substrate layer 116 via flip-chip or conductive adhesives. The electrical signals of the die 118 can include, for example, input/output (I/O) signals and/or power/ground for integrated circuit (IC) devices (not illustrated) formed on the die 118.

In accordance with an embodiment, the bottom package 104 is created via a Mold-Array-Process (MAP). The bottom package 104 further includes an enclosure 128, generally in the form of an encapsulant. The enclosure 128 is etched to expose solder balls 129. Alternatively, the solder balls 129 are added into etched openings 131 of the enclosure 128 after etching the enclosure 128. Solder balls 130 are added to solder balls 129 and can be used to couple the packaging arrangement 100 to a substrate (not illustrated) such as, for example, a printed circuit board (PCB), another package, etc. Alternatively, single solder balls (combined solder balls 129 and solder balls 130) are added into the etched openings 131 after etching the enclosure 128. The solder balls 130 are generally at the sides or around the periphery of the bottom package 104, thereby forming a ball grid array (BGA).

For clarity, materials used within the bottom package 104 and other components within the bottom package 104 may not be illustrated and/or described in detail herein. Such materials and components are generally well-known in the art.

Figure 1B:
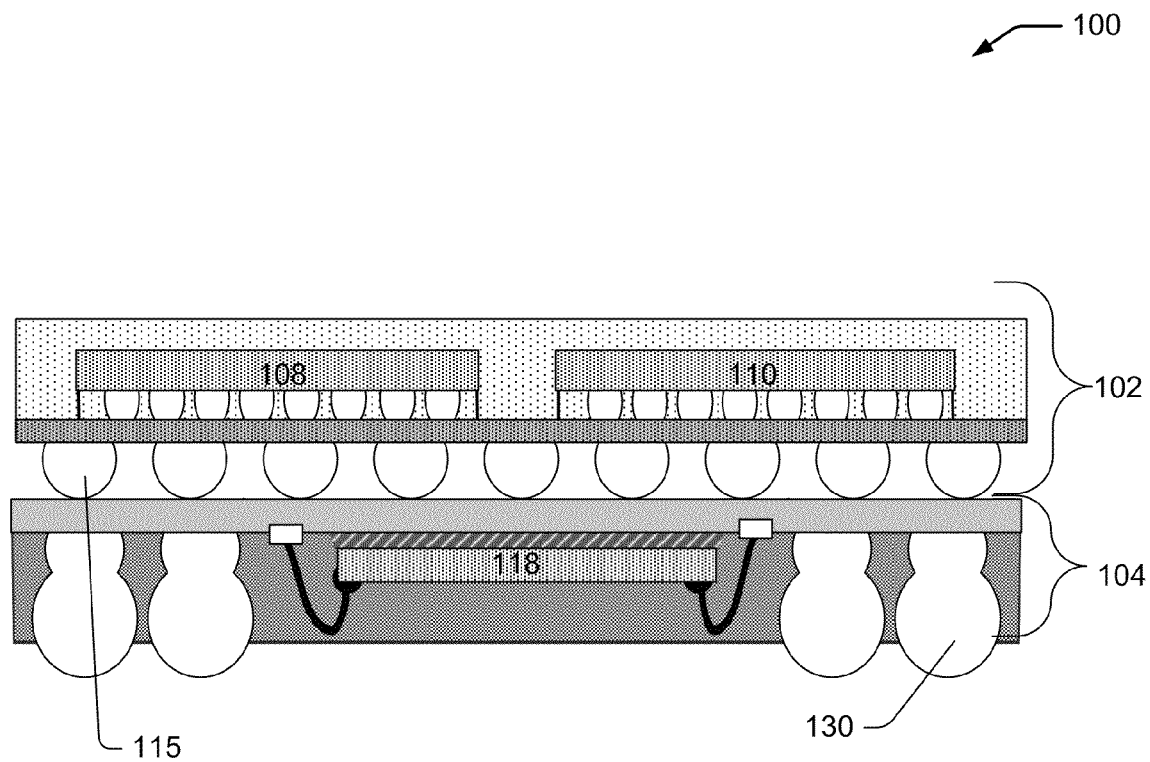
FIG. 1B schematically illustrates the example packaging arrangement of FIG. 1A with a top package attached to a bottom package.

FIG. 1B illustrates the packaging arrangement 100 with the top package 102 attached to the bottom package 104. In the embodiment of FIGS. 1A and 1B, the plurality of solder balls 115 forms a configuration for electrically and physically attaching or stacking the top package 102 to the bottom package 104. As previously noted, top package 102 may comprise two or more individual top packages that are attached to the bottom package 104.

Additional embodiments of the present disclosure generally relate to packaging arrangements that include various embodiments of the bottom package 104 with a die-down flipped structure and are illustrated in FIGS. 2-6. For brevity, the components illustrated in FIG. 1 that are the same as or similar to the components in FIGS. 2-7 are not discussed further herein.

Figure 2:
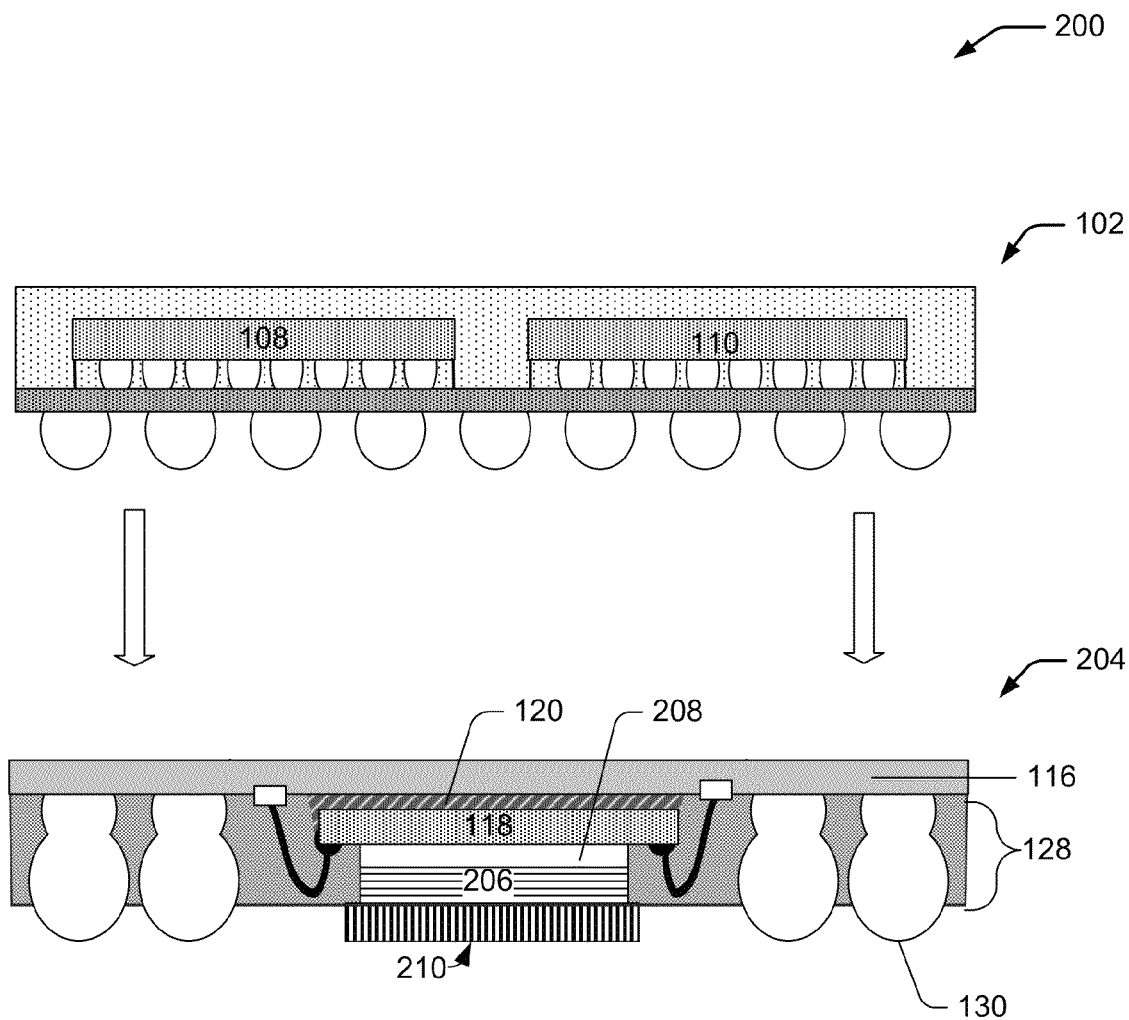
FIG. 2 schematically illustrates another example packaging arrangement that includes another example die arrangement of a die-down flipped PoP structure with exposed material to provide a path for thermal dissipation.

FIG. 2 illustrates another embodiment of a packaging arrangement 200 that includes a top package 102 and a bottom package 204. In the embodiment of FIG. 2, a thermal conductive material 206 is included on a bottom side of the die 118. In an embodiment, the thermal conductive material 206 is attached to the bottom side of the die 118 via an adhesive layer 208. The thermal conductive material 206 includes, but is not limited to, metal, silicon, or any material suitable for good thermal conductivity.

The bottom package 204 includes a thermal interface material (TIM) 210 coupled to the thermal conductive material 206. The TIM 210 includes, but is not limited to, a film, a grease composition, and underfill material. A film may be of an ultra-thin, thermally conductive material, which can be prepared by depositing an amorphous material. A grease composition may include a composition that has high thermal conductivity and excellent dispensation characteristics. A common TIM is a white-colored paste or thermal grease, typically silicone oil filled with aluminum oxide, zinc oxide, or boron nitride. Some types of TIMs use micronized or pulverized silver. Another type of TIM includes phase-change materials. Phase-change materials generally are solid at room temperature but liquefy and behave like grease at operating temperatures.

An underfill material may be chosen based on the desired physical properties. Thus, the thermal conductive material 206 provides a path for thermal dissipation to the TIM 210. The packaging arrangement 200 can be coupled to a substrate (not illustrated) such as, for example, a PCB or another packaging arrangement. A hole may be provided in the substrate to accommodate the TIM 210.

Figure 3:
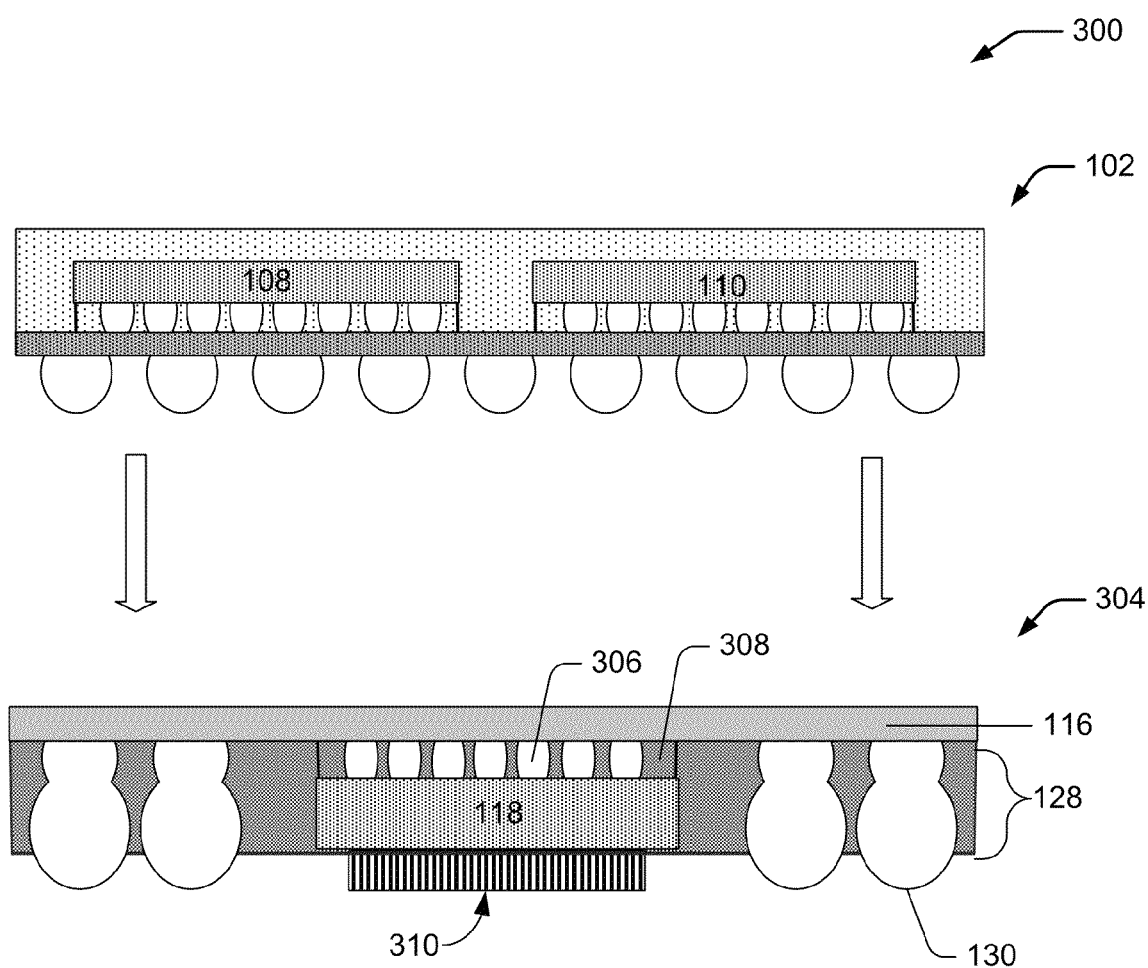
FIG. 3 schematically illustrates another example packaging arrangement that includes another example die arrangement of a die-down flipped PoP structure that is exposed, to provide a path for thermal dissipation.

FIG. 3 illustrates an embodiment of a packaging arrangement 300 that includes a top package 102 and a bottom package 304. The die 118 is attached to the substrate layer 116 via solder balls 306. In accordance with various embodiments, underfill material 308 is provided between the die 118 and the substrate layer 116 among the solder balls 306. The underfill material 308 provides protection of the joints formed by the solder balls 306. It also prevents cracking and delamination of inner layers of the die 118. The underfill material 308 may be a high purity, low stress liquid epoxy. Generally, the larger the size of the solder balls 306, the less need there is for the underfill material 308.

The bottom package 304 includes a thermal interface material (TIM) 310 coupled to a backside of the die 118. The TIM 310 includes, but is not limited to, a film, a grease composition, and underfill material, as previously described. In the embodiment of FIG. 3, the backside of the die 118 is exposed. The exposed backside of the die 118 provides a path for thermal dissipation to the TIM 310. The packaging arrangement 300 can be coupled to a substrate (not illustrated) such as, for example, a PCB or another packaging arrangement. A hole may be provided in the substrate to accommodate the TIM 310.

Figure 4:
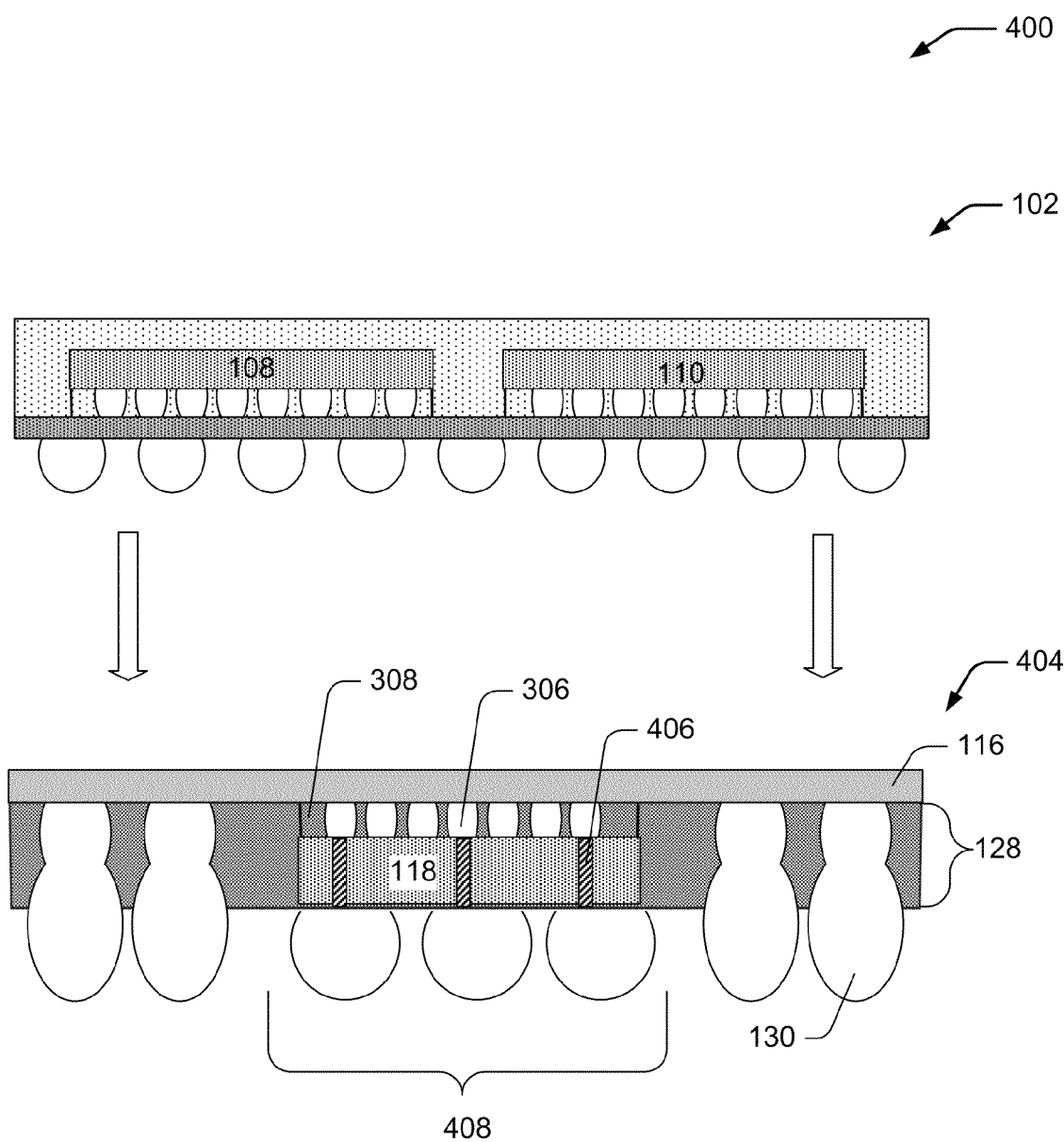
FIG. 4 schematically illustrates another example packaging arrangement that includes another example die arrangement of a die-down flipped PoP structure with through-silicon vias (TSVs).

FIG. 4 illustrates an embodiment of a packaging arrangement 400 that includes a top package 102 and a bottom package 404. The die 118 is attached to the substrate layer 116 via solder bumps 306. Underfill material 308 is provided in a space located between the die 118 and the substrate layer 116 of the bottom package 404. The underfill material 308 provides protection of the joints formed by the solder balls 306.

In the embodiment of FIG. 4, the die 118 includes through-silicon vias (TSVs) 406. In an embodiment, the die 118 may be recessed within the enclosure 128 to help expose the backside of the die 118. The TSVs 406 are vertical electrical connections vias (Vertical Interconnect Access) that pass through the die 118 to the solder balls 306. In an embodiment, the bottom package 404 includes additional solder balls 408 attached to the bottom package 404. The additional solder balls 408 may be used for, for example, ground/power and input/outputs.

The one or more TSVs 406 are electrically coupled to bond pads (not illustrated) and are generally filled with an electrically conductive material, e.g., copper, to route electrical signals through the die 118. The TSVs 406 tend to provide improved performance with respect to bondwires as the density of the vias is substantially higher and the length of the connections is shorter in comparison to bondwires. The exposed backside of the die 118 provides for thermal dissipation of the bottom package 404. Thus, the packaging arrangement 400 can provide increased pincount and higher speeds for electronic devices using the packaging arrangement 400.

Figure 5:
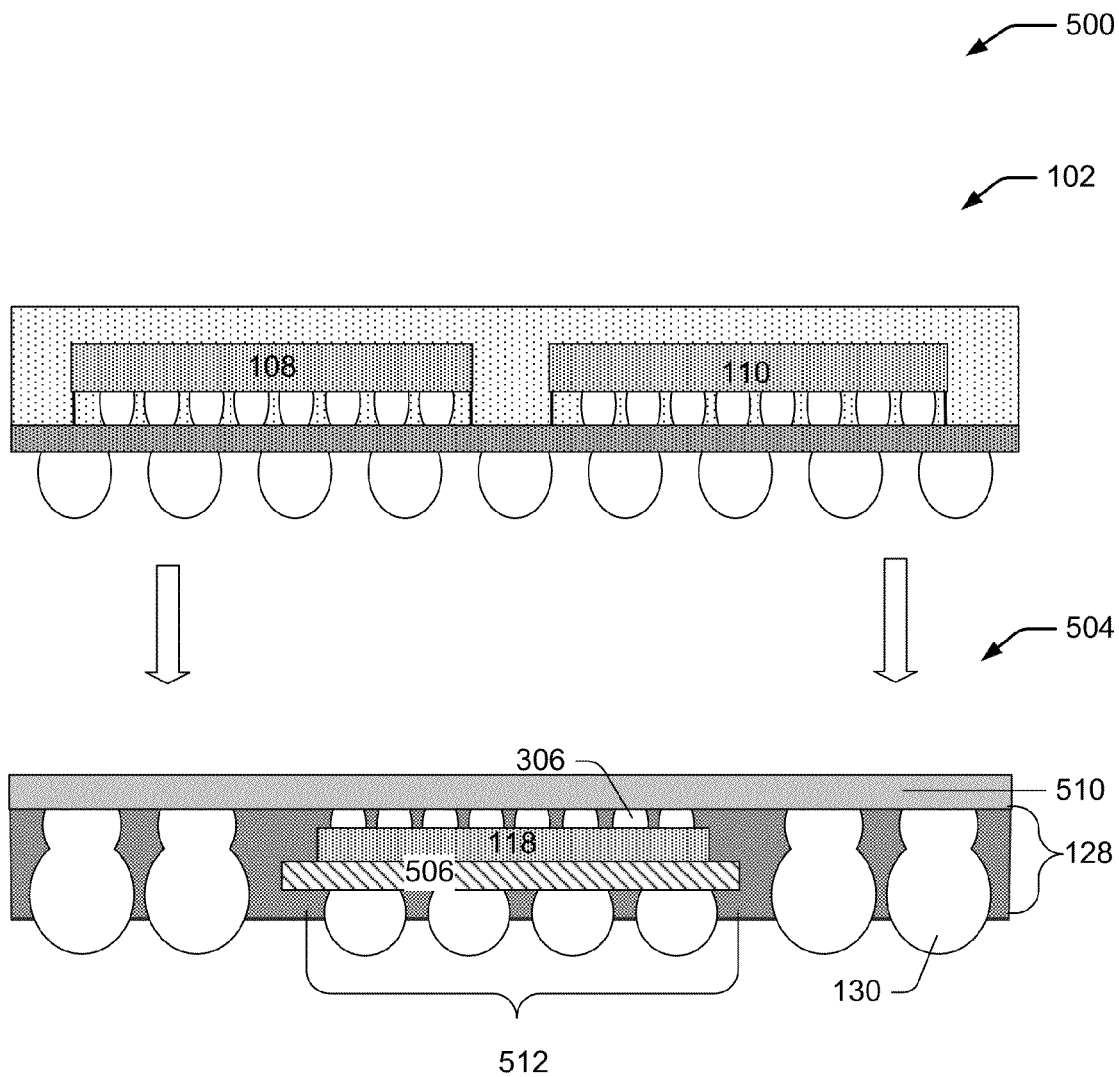
FIG. 5 schematically illustrates another example packaging arrangement that includes another example die arrangement of a die-down flipped PoP structure with an embedded printed circuit board (PCB) and/or an interposer.

FIG. 5 illustrates an embodiment of a packaging arrangement 500 that includes a top package 102 and a bottom package 504. The die 118 is attached to the substrate layer 510 via solder bumps 306.

In the embodiment of FIG. 5, the bottom package 504 includes one or more PCBs and/or interposers 506 attached to the bottom side of the die 118. According to various embodiments, the PCB/interposer 506 is bonded to the die 118 using a thermal compression process or a solder reflow process. That is, one or more electrically conductive structures (e.g., pillars, bumps, pads, redistribution layer) are formed on the PCB/interposer 506 and the die 118 to form a bond between the PCB/interposer 506 and the die 118.

In some embodiments, the die 118 and the PCB/interposer 506 both comprise a material (e.g., silicon) having the same or similar coefficient of thermal expansion (CTE). Using a material having the same or similar CTE for the die 118 and the PCB/interposer 506 reduces stress associated with heating and/or cooling mismatch of the materials.

The PCB/interposer 506 provides a physical buffer, support, and strengthening agent to the die 118, particularly during the formation of the one or more layers to embed the die 118 in the enclosure 128. That is, the die 118 coupled to the PCB/interposer 506 as described herein provides a protected integrated circuit structure that is more structurally resilient than the die 118 alone to stresses associated with fabricating the enclosure 128, resulting in improved yield and reliability of the bottom package 504.

In an embodiment, the bottom package 504 includes additional solder balls 512. The additional solder balls 512 attached to the PCB/interposer 506 may be used for, for example, ground/power and input/outputs.

Figure 6:
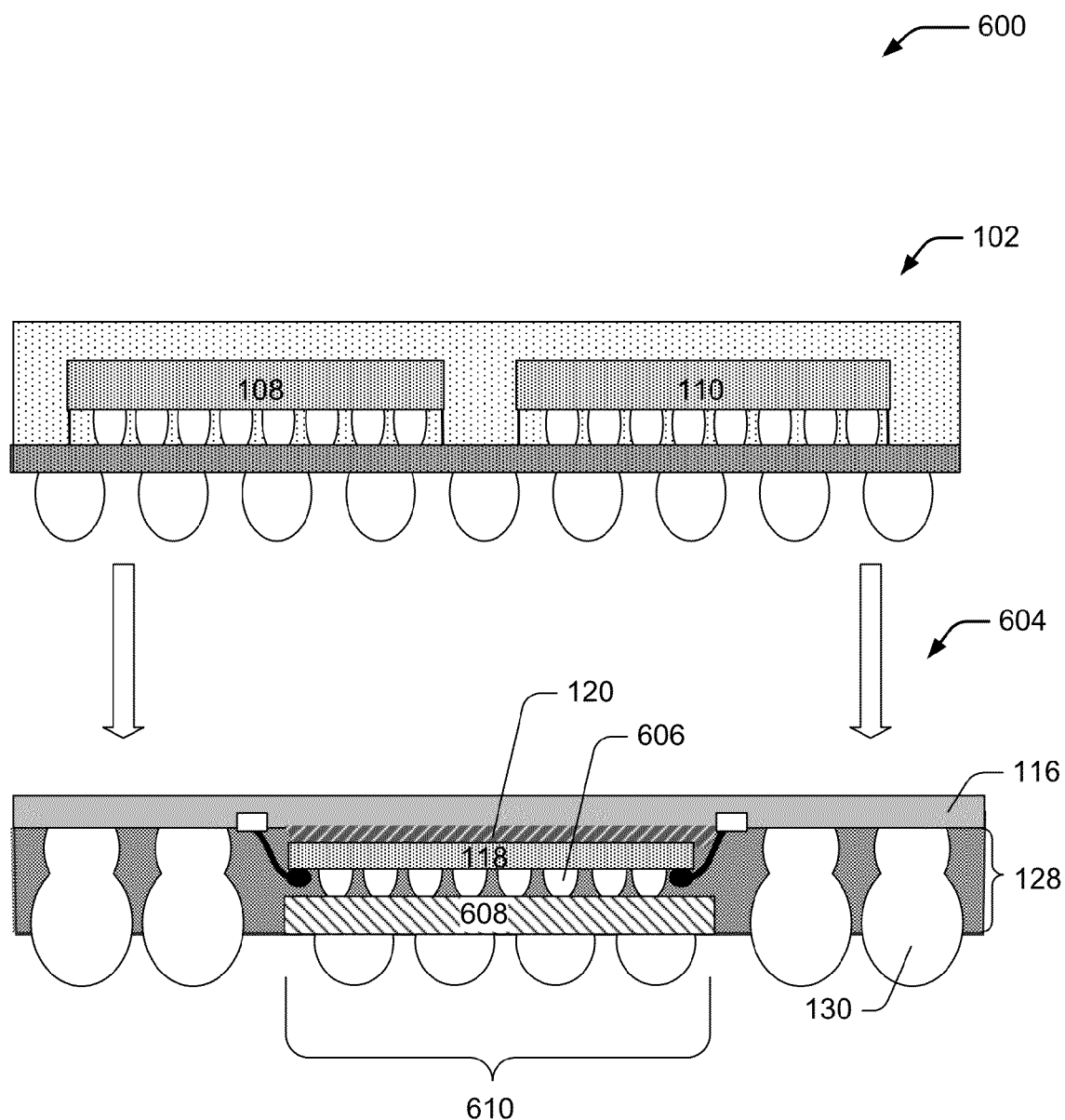
FIG. 6 schematically illustrates another example packaging arrangement that includes another example die arrangement of a die-down flipped PoP structure with a PCB/interposer.

FIG. 6 illustrates an embodiment of a packaging arrangement 600 that includes a top package 102 and a bottom package 604. The die 118 is attached to the substrate layer 116 via the adhesive layer 120. As illustrated, the die 118 is coupled to the substrate layer 116 via a wire bonding process.

Solder bumps 606 are attached to the bottom side of the die 118. A PCB or an interposer 608 is attached to the solder balls 606. In an embodiment, the PCB/interposer 608 may be exposed or recessed. In an embodiment, the bottom package 604 includes additional solder balls 610. The additional solder balls 610 may be used for, for example, ground/power and input/outputs. The embodiment of FIG. 6 can allow for additional pincount and provides a path via the PCB/interposer 608 for thermal dissipation of the bottom package 604.

Figure 7:
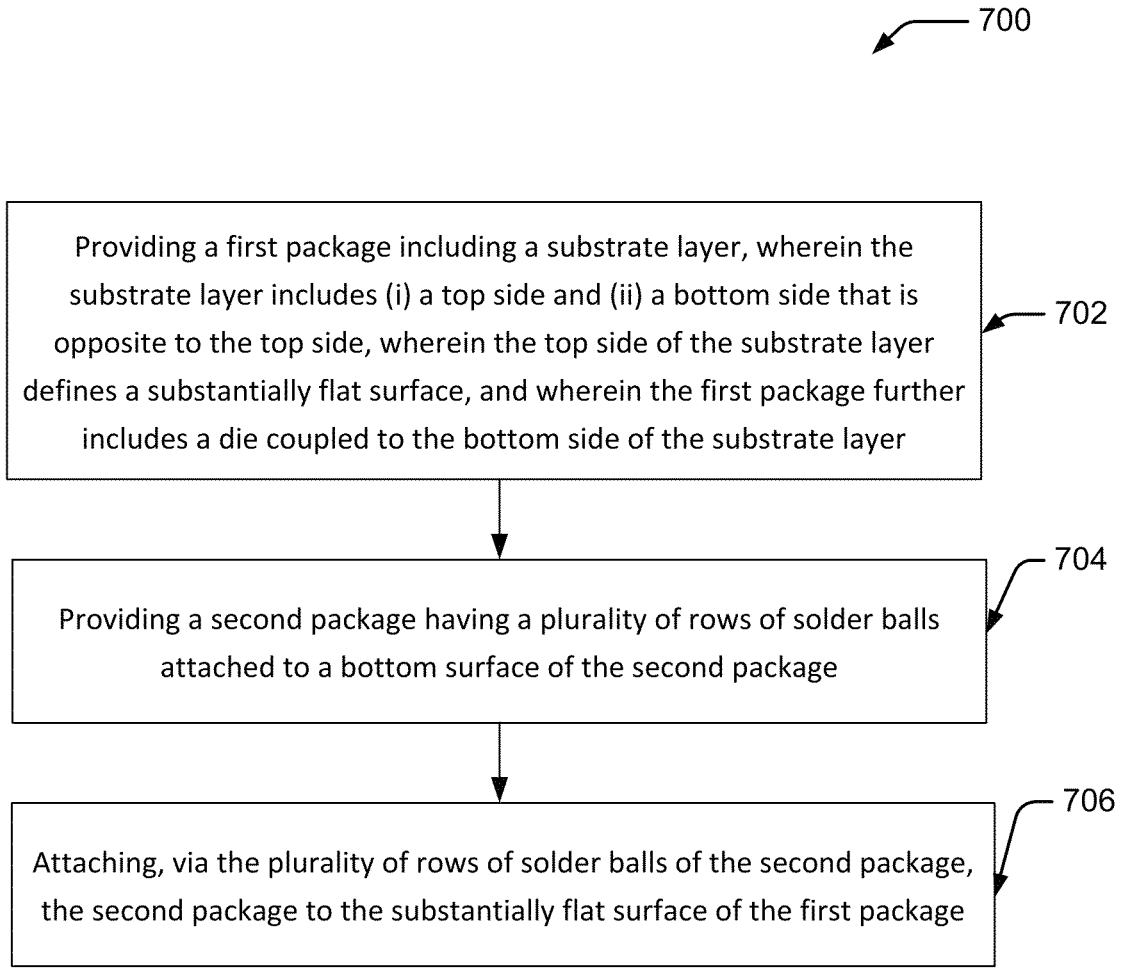
FIG. 7 is a process flow diagram of a method for the PoP structure described herein.
Figure 8:
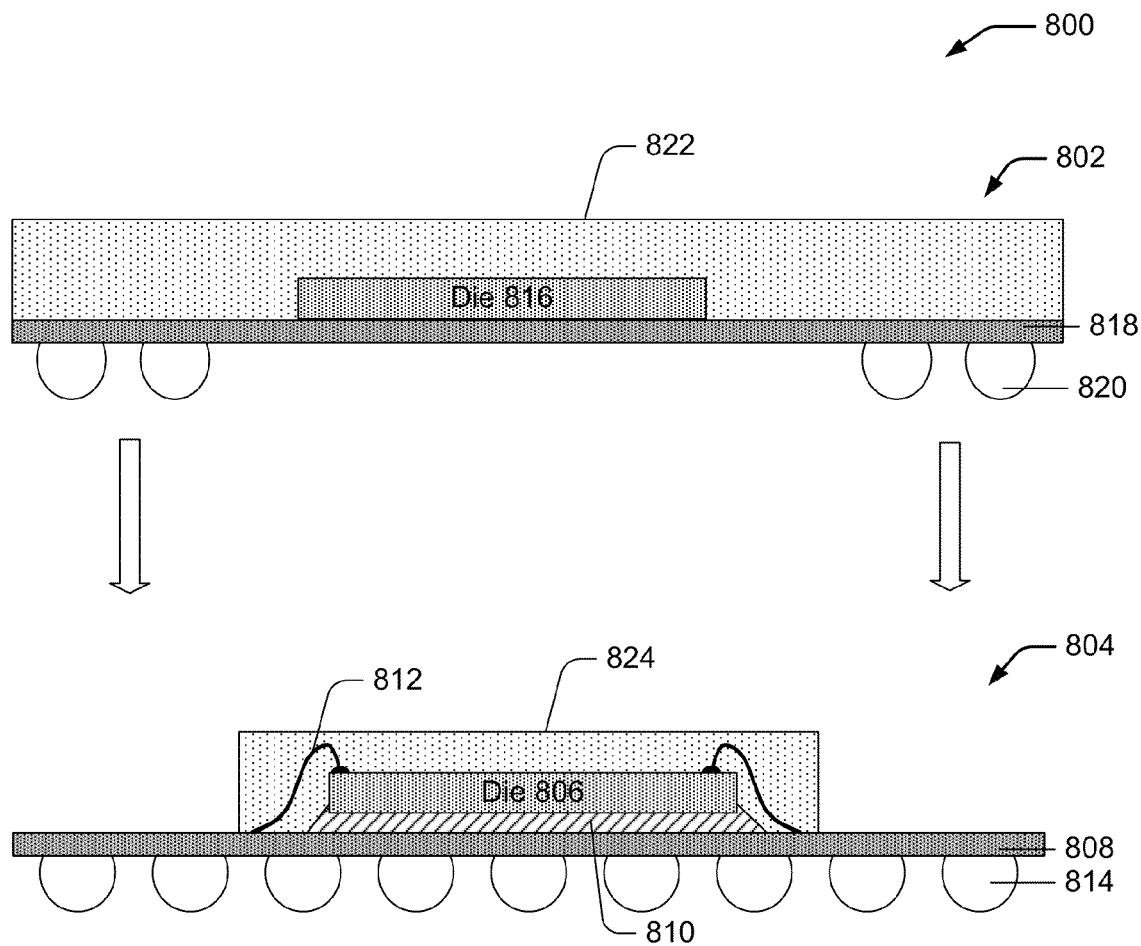
FIG. 8 schematically illustrates an example PoP packaging arrangement.
Figure 9:
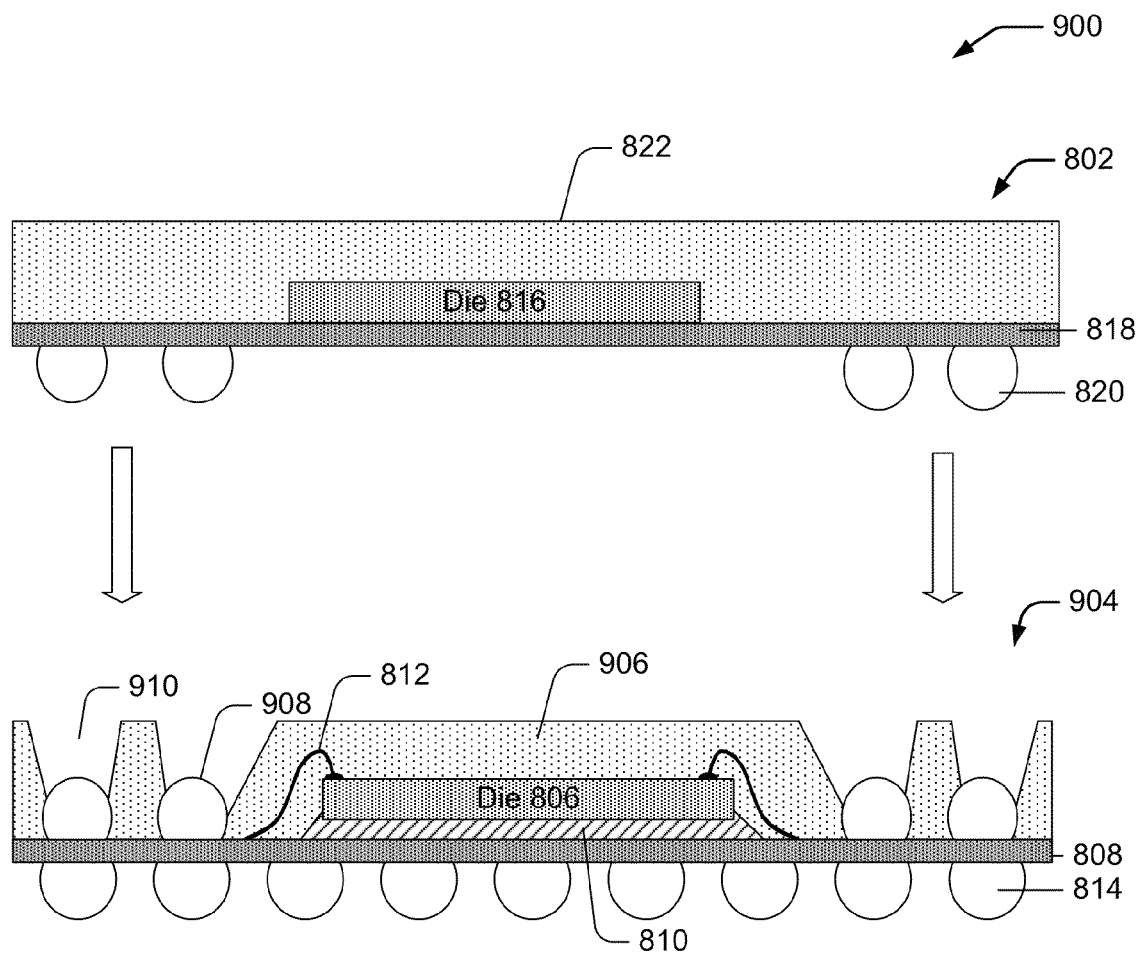
FIG. 9 schematically illustrates another example PoP packaging arrangement.

FIG. 7 illustrates an example method 700, in accordance with an embodiment of the present disclosure. At 702, the method 700 includes providing a first package including a substrate layer, wherein the substrate layer includes (i) a top side and (ii) a bottom side that is opposite to the top side, wherein the top side of the substrate layer defines a substantially flat surface, and wherein the first package further includes a die coupled to the bottom side of the substrate layer.

At 704, the method 700 includes providing a second package having a plurality of rows of solder balls attached to a bottom surface of the second package.

At 706, the method 700 includes attaching, via the plurality of rows of solder balls of the second package, the second package to the substantially flat surface of the first package.

The description may use perspective-based descriptions such as up/down, over/under, and/or, or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A package on package arrangement comprising:
   a first package including
      a substrate layer including (i) a top side, and (ii) a bottom side that is opposite to the top side, wherein the top side of the substrate layer defines a substantially flat surface;
      a die coupled to the bottom side of the substrate layer;
      an encapsulant covering the die;
      a ball grid array (BGA) of first solder balls in recesses of the encapsulant; and
      second solder balls melted by a non-weld process to the first solder balls in the recesses of the encapsulant, wherein the second solder balls (i) are partially in the recesses of the encapsulant and (ii) partially protrude beyond the encapsulant, wherein the portion of the second solder balls that protrudes beyond the encapsulant is substantially spherical, smooth, and void of any sharp features; and
   a second package including
      a plurality of rows of third solder balls that extend (i) across the substantially flat surface of the top side of the substrate layer of the first package and (ii) over the die coupled to the bottom side of the substrate layer of the first package, wherein the second package is attached, via the plurality of rows of third solder balls, to the substantially flat surface of the top side of the substrate layer of the first package.

2. The package on package arrangement of claim 1, further comprising:
   an adhesive layer located between the die and the substrate layer,
   wherein the adhesive layer attaches the die to the bottom side of the substrate layer of the first package.

3. The package on package arrangement of claim 1, further comprising:
   a bond pad located on the bottom side of the die; and
   a substrate pad located on the bottom side of the substrate layer of the first package,
   wherein the bond pad of the die is coupled, via a wire, to the substrate pad of the substrate layer to route electrical signals of the die.

4. The package on package arrangement of claim 1, wherein:
   the substrate layer comprises a first substrate layer;
   the second package comprises a first die arranged next to a second die; and
   each of the first die and the second die is connected to a second substrate layer in the second package via fourth solder balls.

5. The package on package arrangement of claim 4, wherein at least some of the plurality of rows of third solder balls are between (i) the first die and the second die of the second package and (ii) the die coupled to the bottom side of the substrate layer.

6. The package on package arrangement of claim 1, further comprising:
   thermal interface material attached to a bottom side of the die.

7. The package on package arrangement of claim 6, further comprising:
   thermal conductive material attached to the thermal interface material.

8. The package on package arrangement of claim 7, wherein the thermal interface material comprises one of a film, a grease composition, or an underfill material.

9. The package on package arrangement of claim 1, further comprising:
fourth solder balls attached to the bottom side of the substrate layer and a top side of the die; and
a plurality of through-silicon vias located in the die, wherein the plurality of through-silicon vias respectively extend between (i) at least some of the fourth solder balls and (ii) a plurality of fifth solder balls that are attached to a bottom side of the bottom package.

10. A stackable semiconductor package comprising:
a first package including
a substrate layer including (i) a top side, and (ii) a bottom side that is opposite to the top side, wherein the top side of the substrate layer defines a substantially flat surface;
a die coupled to the bottom side of the substrate layer;
an encapsulant covering the die;
a ball grid array (BGA) of first solder balls in recesses of the encapsulant;
second solder balls melted to the first solder balls in the recesses of the encapsulant, wherein the second solder balls (i) are partially in the recesses of the encapsulant and (ii) partially protrude beyond the encapsulant by a first distance; and
third solder balls (i) electrically connected to the die via an interposer and (ii) protruding beyond the encapsulant by a second distance equal to the first distance; and
a second package including
a plurality of rows of fourth solder balls that extend (i) across the substantially flat surface of the top side of the substrate layer of the first package and (ii) over the die coupled to the bottom side of the substrate layer of the first package, wherein the second package is attached, via the plurality of rows of fourth solder balls, to the substantially flat surface of the top side of the substrate layer of the first package.

11. The package on package arrangement of claim 10, further comprising:
an adhesive layer located between the die and the substrate layer,
wherein the adhesive layer attaches the die to the bottom side of the substrate layer of the first package.

12. The package on package arrangement of claim 10, further comprising:
a bond pad located on the bottom side of the die; and
a substrate pad located on the bottom side of the substrate layer of the first package,
wherein the bond pad of the die is coupled, via a wire, to the substrate pad of the substrate layer to route electrical signals of the die.

13. The package on package arrangement of claim 10, wherein:
the substrate layer comprises a first substrate layer;
the second package comprises a first die arranged next to a second die; and
each of the first die and the second die is connected to a second substrate layer in the second package via fifth solder balls.

14. The package on package arrangement of claim 10, further comprising:
thermal interface material attached to a bottom side of the die.

15. The package on package arrangement of claim 14, further comprising:
thermal conductive material attached to the thermal interface material.

16. The package on package arrangement of claim 15, wherein the thermal interface material comprises one of a film, a grease composition, or an underfill material.

17. The package on package arrangement of claim 10, further comprising:
a printed circuit board attached to a bottom side of the die.

18. The package on package arrangement of claim 10, further comprising:
third solder balls attached to the bottom side of the substrate layer and a top side of the die; and
a plurality of through-silicon vias located in the die, wherein the plurality of through-silicon vias respectively extend between at least some of the third solder balls, and a plurality of fourth solder balls that are attached to a bottom side of the bottom package.

19. The package on package arrangement of claim 10, further comprising:
fifth solder balls attached to the bottom side of the substrate layer and a top side of the die.

* * * * *